United States Patent
Yamazaki et al.

(10) Patent No.: US 8,232,181 B2
(45) Date of Patent: Jul. 31, 2012

(54) MANUFACTURING METHOD OF SEMICONDUCTOR DEVICE

(75) Inventors: Shunpei Yamazaki, Setagaya (JP); Ryosuke Watanabe, Isehara (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/953,066

(22) Filed: Nov. 23, 2010

(65) Prior Publication Data

US 2011/0104859 A1 May 5, 2011

Related U.S. Application Data

(62) Division of application No. 11/989,328, filed as application No. PCT/JP2006/314933 on Jul. 21, 2006, now Pat. No. 7,863,154.

(30) Foreign Application Priority Data

Jul. 29, 2005 (JP) ................................. 2005-222161

(51) Int. Cl.
*H01L 21/30* (2006.01)
*H01L 21/46* (2006.01)
*H01L 21/00* (2006.01)
*G06K 19/077* (2006.01)
*G06K 19/07* (2006.01)

(52) U.S. Cl. ........ 438/455; 438/121; 438/125; 438/597; 257/E21.499; 257/E21.575

(58) Field of Classification Search ............... 438/121, 438/125, 597; 257/E21.499, E21.575
See application file for complete search history.

(56) References Cited

U.S. PATENT DOCUMENTS

| 5,972,780 A | 10/1999 | Machida et al. |
| 6,092,578 A * | 7/2000 | Machida et al. ............ 156/358 |
| 6,268,235 B1 | 7/2001 | Sakakura et al. |

(Continued)

FOREIGN PATENT DOCUMENTS

JP 10-189566 7/1998

(Continued)

OTHER PUBLICATIONS

International Search Report (Application No. PCT/JP2006/314933) dated Oct. 31, 2006.

(Continued)

*Primary Examiner* — Zandra Smith
*Assistant Examiner* — Jeremy Joy
(74) *Attorney, Agent, or Firm* — Eric J. Robinson; Robinson Intellectual Property Law Office, P.C.

(57) ABSTRACT

A manufacturing method of a semiconductor device is provided, which includes a process in which a transistor is formed over a first substrate; a process in which a first insulating layer is formed over the transistor; a process in which a first conductive layer connected to a source or a drain of the transistor is formed; a process in which a second substrate provided with a second insulating layer is arranged so that the first insulating layer is attached to the second insulating layer; a process in which the second insulating layer is separated from the second substrate; and a process in which a third substrate provided with a second conductive layer which functions as an antenna is arranged so that the first conductive layer is electrically connected to the second conductive layer.

24 Claims, 12 Drawing Sheets

U.S. PATENT DOCUMENTS

| | | | |
|---|---|---|---|
| 6,709,901 B1 | 3/2004 | Yamazaki et al. | |
| 6,806,499 B2 | 10/2004 | Yamazaki et al. | |
| 7,130,234 B2 | 10/2006 | Shionoiri et al. | |
| 7,176,069 B2 | 2/2007 | Yamazaki et al. | |
| 7,271,076 B2 | 9/2007 | Yamazaki et al. | |
| 7,405,665 B2 | 7/2008 | Yamazaki | |
| 7,452,786 B2 | 11/2008 | Dozen et al. | |
| 7,591,863 B2 | 9/2009 | Watanabe et al. | |
| 7,605,056 B2 | 10/2009 | Takahashi et al. | |
| 7,632,721 B2 | 12/2009 | Yamazaki et al. | |
| 7,768,405 B2 | 8/2010 | Yamazaki et al. | |
| 7,785,708 B2 | 8/2010 | Tatsuzawa et al. | |
| 7,995,183 B2 | 8/2011 | Yamazaki et al. | |
| 2003/0032210 A1* | 2/2003 | Takayama et al. | 438/30 |
| 2004/0129450 A1* | 7/2004 | Yamazaki et al. | 174/250 |
| 2004/0164302 A1 | 8/2004 | Arai et al. | |
| 2005/0051870 A1* | 3/2005 | Yamazaki et al. | 257/531 |
| 2005/0134463 A1* | 6/2005 | Yamazaki | 340/572.8 |
| 2005/0287846 A1* | 12/2005 | Dozen et al. | 439/85 |
| 2007/0077691 A1 | 4/2007 | Watanabe | |
| 2007/0166364 A1* | 7/2007 | Beier et al. | 424/449 |
| 2009/0269886 A1 | 10/2009 | Yamazaki et al. | |
| 2012/0012851 A1 | 1/2012 | Yamazaki et al. | |

FOREIGN PATENT DOCUMENTS

| | | | |
|---|---|---|---|
| JP | 2002-268585 | | 9/2002 |
| JP | 2002268585 A | * | 9/2002 |
| JP | 2004-282050 | | 10/2004 |
| JP | 2005-202947 | | 7/2005 |

OTHER PUBLICATIONS

Written Opinion (Application No. PCT/JP2006/314933) dated Oct. 31, 2006.

* cited by examiner

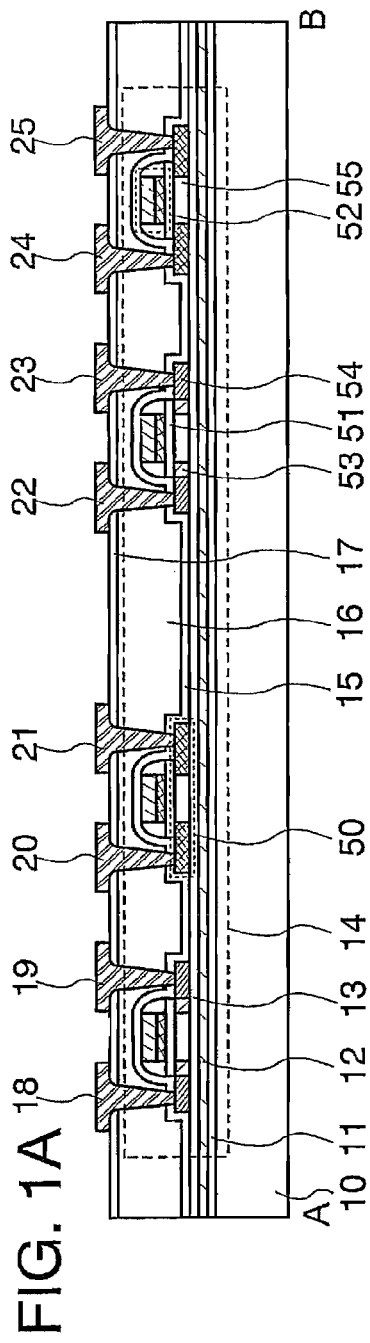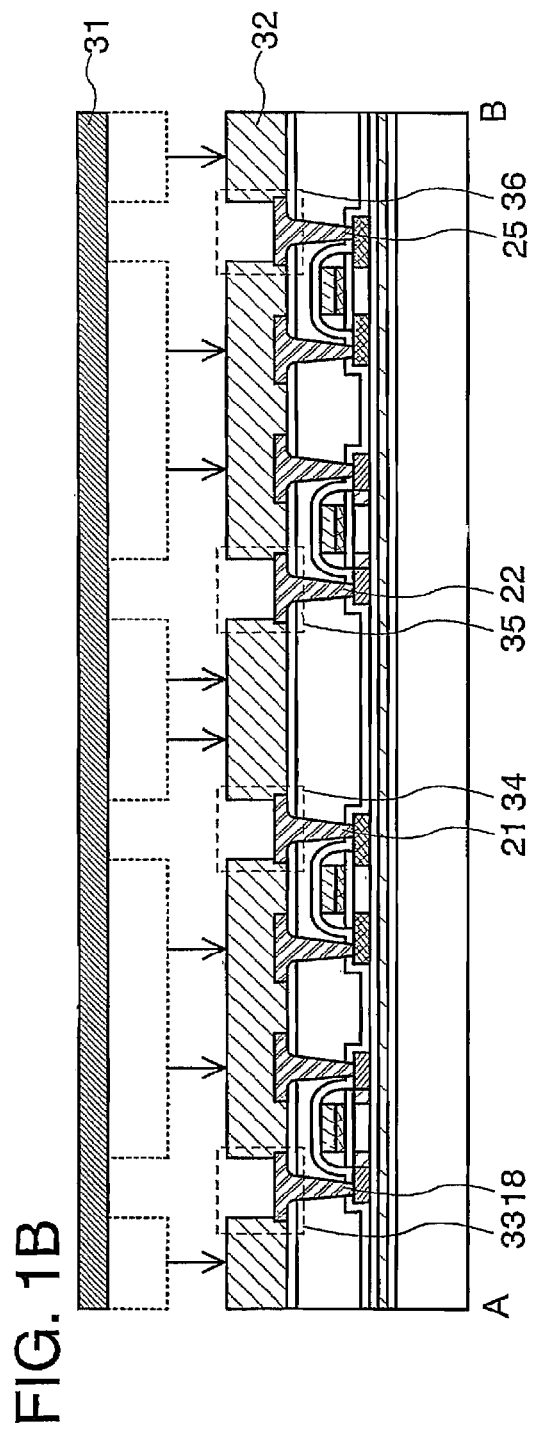

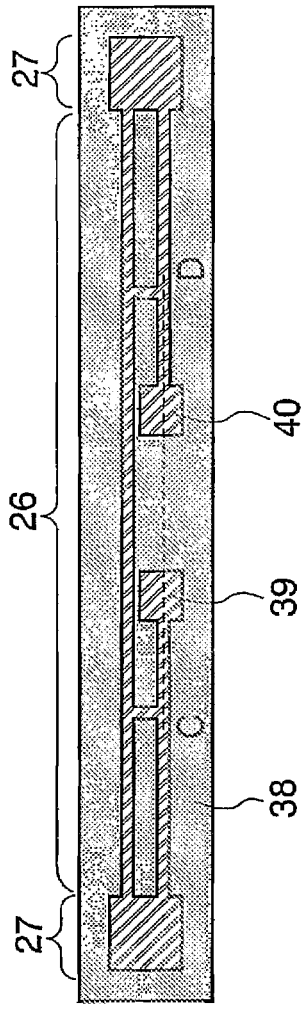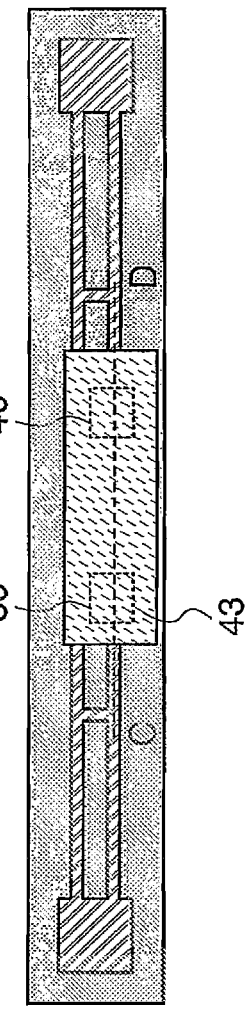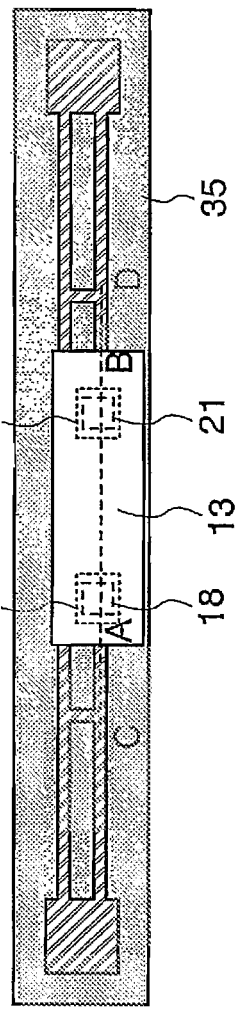
FIG. 4A
FIG. 4B
FIG. 4C

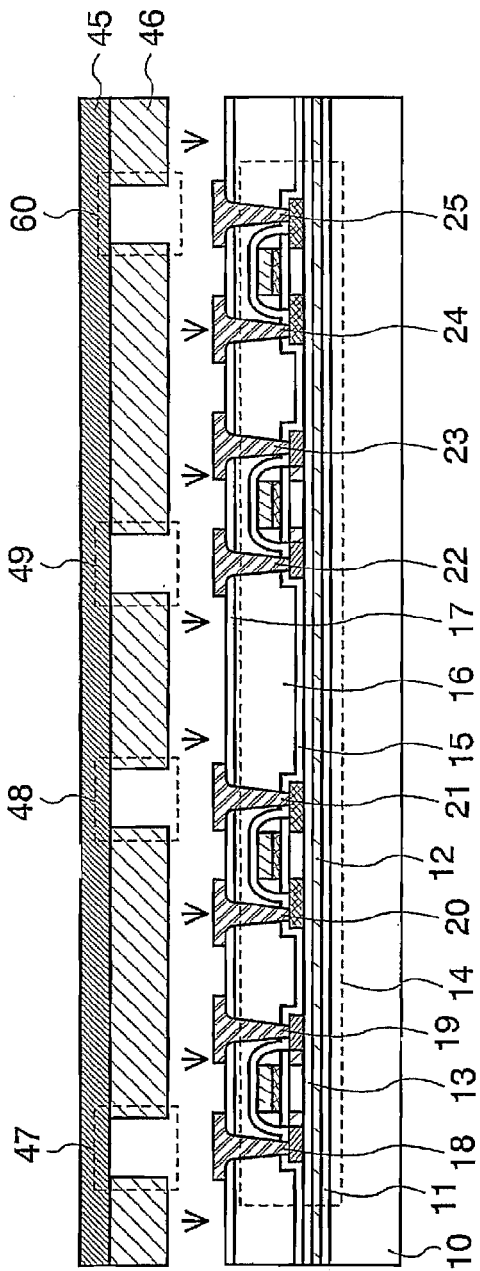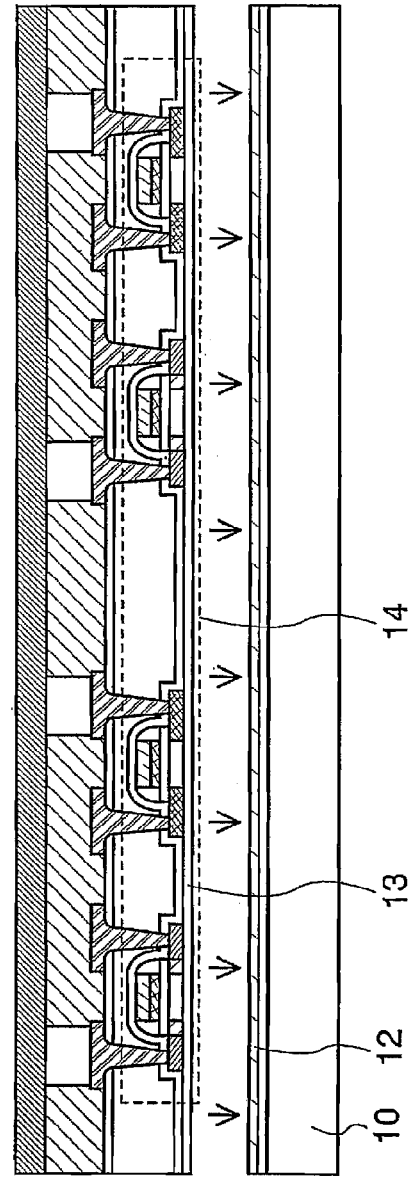
FIG. 6A
FIG. 6B

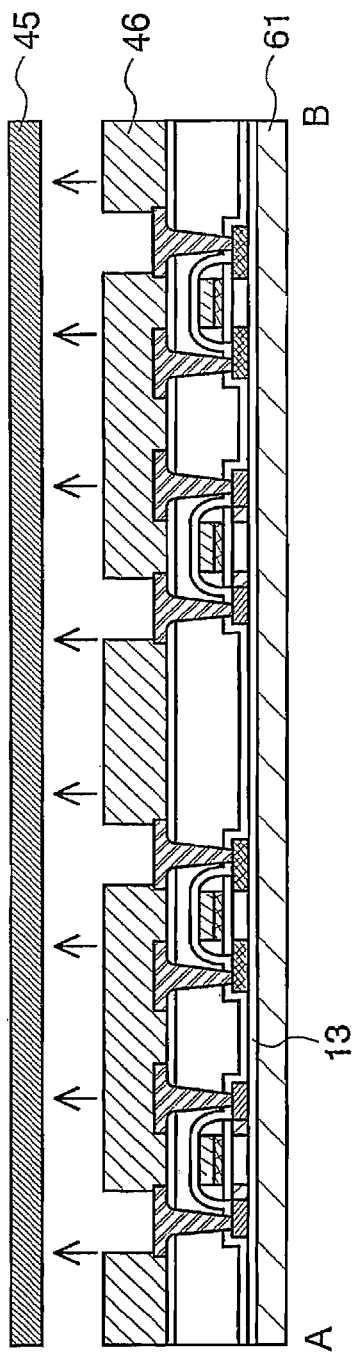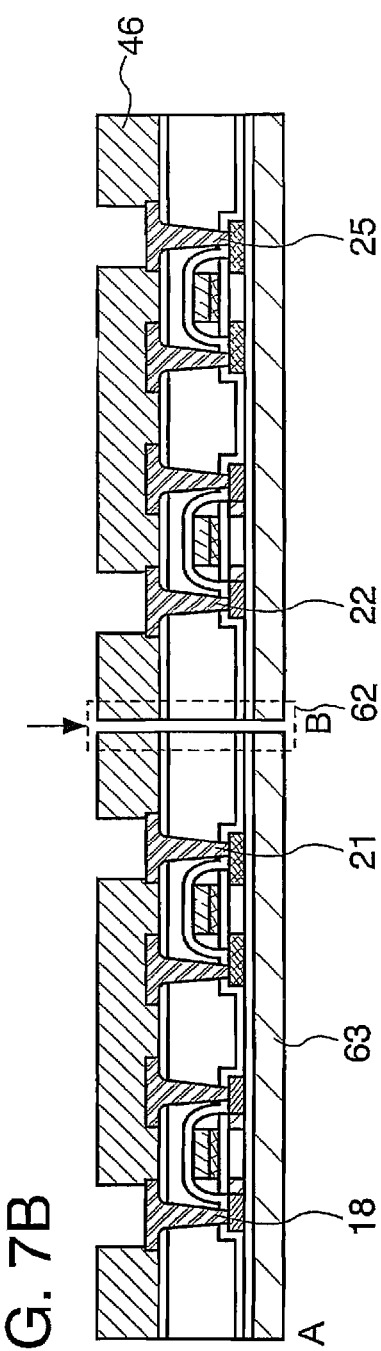

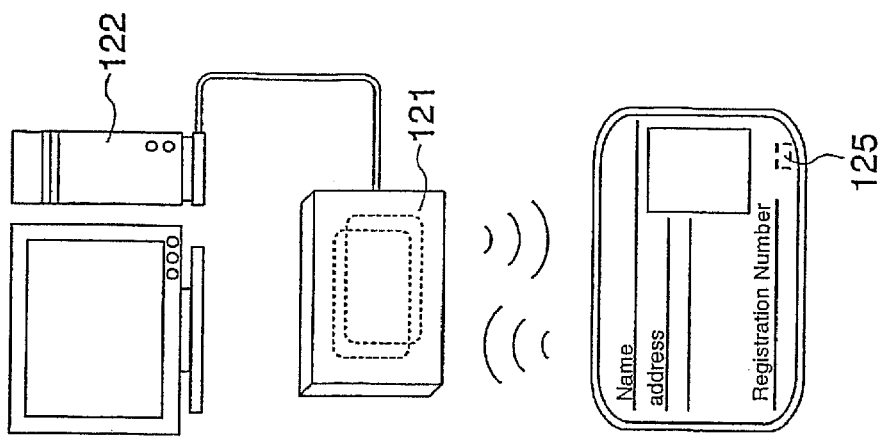
FIG. 12E
FIG. 12C
FIG. 12D
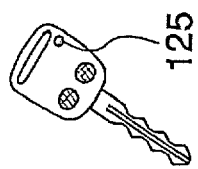
FIG. 12A
FIG. 12B

MANUFACTURING METHOD OF SEMICONDUCTOR DEVICE

TECHNICAL FIELD

The present invention relates to a semiconductor device. The semiconductor device includes a transistor.

BACKGROUND ART

In recent years, development of semiconductor devices which can transmit and receive data wirelessly has advanced. Such semiconductor devices are called an RFID (Radio Frequency Identification), an RF chip, an RF tag, an IC chip, an IC tag, an IC label, a wireless chip, a wireless tag, an electronic chip, an electronic tag, a wireless processor, a wireless memory and the like (for example, refer to Patent Document 1: Japanese Patent Laid-Open No. 2004-282050), and have already been introduced into some fields. Semiconductor devices which can transmit and receive data wirelessly are classified roughly into two categories: semiconductor devices where a substrate in which both a transistor and an antenna are provided is used, and semiconductor devices where a first substrate provided with a transistor and a second substrate provided with an antenna are used.

DISCLOSURE OF INVENTION

It is an object of the present invention to provide a semiconductor device in which reliability is improved by improving strength. In addition, it is another object of the present invention to provide a semiconductor device in which high added value is realized by improving strength. Moreover, it is another object of the present invention to improve productivity of semiconductor devices.

A semiconductor device of the present invention features an insulating layer (also called a protecting layer or a buffer layer) which has a film thickness of 10 μm to 300 μm provided between a stacked body including a plurality of transistors and a substrate provided with a conductive layer. Through this, strength and reliability can be improved. In addition, reliability can be improved and high added value can be realized by improving strength.

A semiconductor device of the present invention has a transistor, a first insulating layer formed over the transistor, a first conductive layer connected with a source or a drain of the transistor through an opening portion formed in the first insulating layer, a second insulating layer formed over the first insulating layer and the first conductive layer, a second conductive layer formed over the second insulating layer, and a substrate formed over the second insulating layer and the second conductive layer. The first conductive layer is connected with the second conductive layer electrically through an opening portion provided in the second insulating layer. In addition, a thickness of the second insulating layer is 10 to 300 μm, more preferably, 50 μm to 300 μm.

In the above structure, the first conductive layer corresponds to a source wiring or a drain wiring. Also, the second conductive layer functions as a connection wire. In addition, the second conductive layer functions as an antenna. Furthermore, the second insulating layer (also called a protecting layer or a buffer layer) is silicone polyethylene, polypropylene, polystyrene, acrylic, polyvinyl chloride, polyacetal, polyamide, polycarbonate, polybutylene terephthalate, polyethylene naphthalate, polyethylene terephthalate, polysulfone, polyethersulfone, polyphenylene sulfide, polyamideimide, polymethylpentene, phenol, urea, melamine, epoxy, diallylphthalate, polyimide, or polyurethane.

A manufacturing method of a semiconductor device of the present invention includes a process in which a transistor is formed over a first substrate, a process in which a first insulating layer is formed over the transistor, a process in which a first conductive layer which is connected to a source or a drain of the transistor through an opening portion formed in the first insulating layer is formed, a process in which a second substrate which has a second insulating layer is arranged over the first insulating layer so that the first insulating layer is bonded to the second insulating layer, a process in which the first substrate, the first insulating layer, the first conductive layer, and the second insulating layer are separated from the substrate, and a process in which a third substrate which has an anisotropic conductive layer and the second conductive layer which functions as an antenna provided over the second insulating layer is arranged, and the first conductive layer is electrically connected with the second conductive layer through the anisotropic conductive layer.

A manufacturing method of a semiconductor device of the present invention includes a process in which a transistor is formed over a first substrate, a process in which a first insulating layer is formed over the transistor, a process in which a first conductive layer which is connected to a source or a drain of the transistor through an opening portion formed in the first insulating layer is formed, a process in which a second substrate which has a second insulating layer is arranged over the first insulating layer so that the first insulating layer is bonded to the second insulating layer, a process in which the first substrate, the first insulating layer, the first conductive layer, and the second insulating layer are separated from the substrate, and a process in which a third substrate which has an anisotropic conductive layer and the second conductive layer which functions as an antenna provided over the second insulating layer is arranged and the first conductive layer is electrically connected with the second conductive layer through the anisotropic conductive layer.

According to the present invention having the above structure, a semiconductor device having improved strength and reliability can be provided. In addition, by improving strength, a semiconductor device in which high added value is realized can be provided. Moreover, according to the present invention having the above structure, a manufacturing method of a semiconductor device having improved productivity can be provided.

BRIEF DESCRIPTION OF DRAWINGS

FIGS. 1A and 1B show a semiconductor device of the present invention and a manufacturing method thereof;

FIGS. 4A to 4C show a semiconductor device of the present invention and a manufacturing method thereof;

FIGS. 6A and 6B show a semiconductor device of the present invention and a manufacturing method thereof;

FIGS. 7A and 7B show a semiconductor device of the present invention and a manufacturing method thereof;

FIGS. 12A to 12E show semiconductor devices.

BEST MODE FOR CARRYING OUT THE INVENTION

Figure 2A:
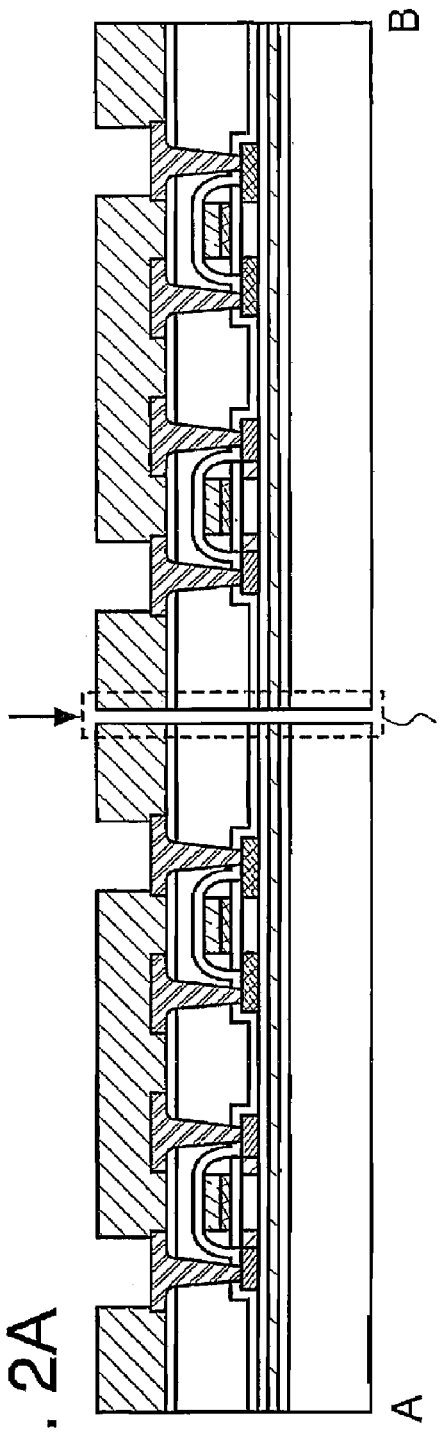
FIGS. 2A and 2B show a semiconductor device of the present invention and a manufacturing method thereof.

Although the invention will be described by way of embodiment mode and embodiments with reference to the accompanying drawings, it is to be understood that various changes and modifications will be apparent to those skilled in the art. Therefore, unless such changes and modifications depart from the scope of the invention, they should be construed as being included therein. Note that in the following description of the invention, the identical portions are denoted by the identical reference numerals in different drawings.

Embodiment Mode 1

A structure of a semiconductor device of the present invention and a manufacturing method thereof will be described with reference to cross-sectional views in FIGS. 1A to 2B and top views in FIGS. 3A to 4C. Note that FIGS. 1A, 1B, 2A, and 2B are cross-sectional views along a line from point A to point B of top views in FIGS. 3A, 3B, 3C, and 4C, respectively.

First, an insulating layer 11 is formed over one surface, of a substrate 10 (see FIG. 1A). Next, a separation layer 12 is formed over the insulating layer 11. Then, an insulating layer 13 is formed over the separation layer 12.

The substrate 10 is a glass substrate, a plastic substrate, a silicon substrate, a quartz substrate, or the like. As the substrate 10, a glass substrate or a plastic substrate is preferably used. This is because a glass substrate or a plastic substrate having a side of 1 meter or more or having a predetermined shape such as a square can be easily manufactured. Thus, when a glass substrate or a plastic substrate which has a square shape and has a side of 1 meter or more is used, for example, productivity can be drastically improved. This is a great advantage compared with the case of using a silicon substrate having a circular shape with a diameter of about 30 centimeters at most.

The insulating layers 11 and 13 are formed oxide of silicon, nitride of silicon, oxide of silicon containing nitrogen, nitride of silicon containing oxygen, or the like by a plasma CVD method or a sputtering method. The insulating layer 11 prevents an impurity element from entering the substrate 10 from entering an upper layer. If not required the insulating layer 11 does not have to be formed.

The separation layer 12 is formed with a single layer or a stacked layer formed by a plasma CVD method or a sputtering method by using an element selected from among tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si), or an alloy material or a compound material containing the above described element as its main component. The crystal structure of a layer containing silicon as the separation layer 12 may be any one of the amorphous, microcrystalline, and polycrystalline structure.

In the case where the separation layer 12 has a single-layer structure, a layer containing any one of tungsten, molybdenum, a mixture of tungsten and molybdenum, oxide of tungsten, oxynitride of tungsten, nitride oxide of tungsten, oxide of molybdenum, oxynitride of molybdenum, nitride oxide of molybdenum, oxide of a mixture of tungsten and molybdenum, oxynitride of a mixture of tungsten and molybdenum, or nitride oxide of a mixture of tungsten and molybdenum is formed, preferably.

In the case where the separation layer 12 has a stacked structure, it is preferable to form a tungsten layer, a molybdenum layer, or a layer containing a mixture of tungsten and molybdenum as a first layer, and form a layer containing oxide or oxynitride of tungsten, a layer containing oxide or oxynitride of molybdenum, or a layer containing oxide or oxynitride of a mixture of tungsten and molybdenum as a second layer.

When the separation layer 12 is formed to have a stack of a layer containing tungsten and a layer containing oxide of tungsten, first, the layer containing tungsten may be formed as the separation layer 12 and a layer containing oxide of silicon may be formed as the insulating layer 13 thereover so that a layer containing oxide of tungsten is formed at the interface between the layer containing tungsten and the layer containing oxide of silicon. This also applies to the case of forming a layer containing nitride, oxynitride, or nitride oxide of tungsten or the like. In such a case, after a layer containing tungsten is formed, a layer containing nitride of silicon, a silicon nitride layer containing oxygen, or a silicon oxide layer containing nitrogen may be formed thereover.

Next, a plurality of transistors 14 is formed over the insulating layer 13. In this process, thin film transistors are formed as the plurality of transistors 14.

Each of the plurality of transistors 14 includes a semiconductor layer 50, a gate insulating layer 51 (also called merely an insulating layer), and a conductive layer 52 serving as a gate (also called a gate electrode). The semiconductor layer 50 includes impurity regions 53 and 54 which function as a source or drain, and a channel forming region 55. The impurity regions 53 and 54 are doped with an impurity element imparting N-type conductivity (such as phosphorus (P) or arsenic (As)) or an impurity element imparting P-type conductivity (for example, boron (B)). The impurity region 54 is an LDD (Lightly Doped Drain) region.

Each of the plurality of transistors 14 may have either of a top-gate structure in which the gate insulating layer 51 is formed over the semiconductor layer 50 and the conductive layer 52 is formed over the gate insulating layer 51, or a bottom-gate structure in which the gate insulating layer 51 is formed over the conductive layer 52 and the semiconductor layer 50 is formed over the gate insulating layer 51. In addition, one or more transistors selected from the plurality of transistors 14 may be a multi gate structure transistor which has two or more gate electrodes and two or more channel forming regions.

Note that in the structure shown in FIG. 1A, only the plurality of transistors 14 is formed over the substrate 10; however, the present invention is not limited thereto. An element formed over the substrate 10 may be changed as is appropriate in accordance with the usage of the semiconductor device. For example, in the case of a device having a function of transmitting and receiving data wirelessly, a plurality of transistors, or a plurality of transistors and a conductive layer which functions as an antenna, may be formed over the substrate 10. In addition, in the case of forming a semiconductor device having a function of storing data, a plurality of transistors and a memory element (for example, a transistor, a memory transistor, or the like) are preferably formed over the substrate 10. Further, in the case of forming a semiconductor device (for example, a CPU, a signal generation circuit, or the like) having a function of controlling a circuit or generating a signal or the like, a transistor may be formed over the substrate 10. In addition to the above-mentioned elements, another element such as a resistor or a capacitor may be formed if necessary.

Next, insulating layers 15 to 17 are formed over the plurality of transistors 14. The insulating layers 15 to 17 are formed with an oxide of silicon, a nitride of silicon, polyimide, acrylic, silicone, siloxane, or the like by a plasma CVD method, a sputtering method, an SOG (Spin On Glass) method, a droplet discharge method, or the like. Siloxane is composed of, for example, a skeleton formed by the bond of silicon and oxygen, in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

In the above described structure, a three-layered insulating layer (the insulating layers 15 to 17) is formed over the plurality of transistors 14; however, the present invention is not limited thereto. The number of insulating layers provided over the plurality of transistors 14 is not particularly limited.

Figure 3A:
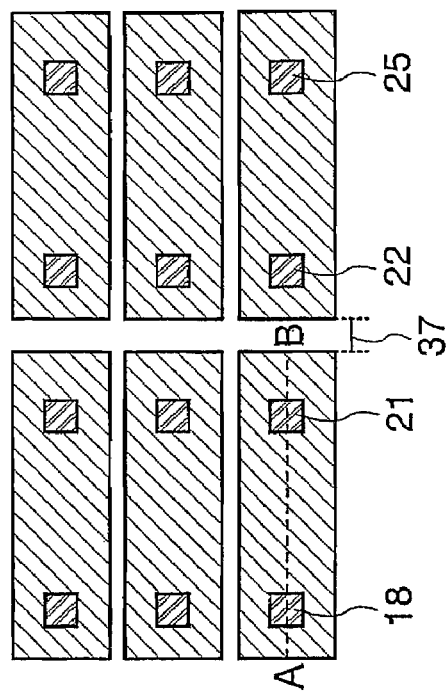
FIGS. 3A to 3C show a semiconductor device of the present invention and a manufacturing method thereof.

Subsequently, opening portions are formed in the insulating layers 15 to 17 and conductive layers 18 to 25 are formed, which are each connected to a source (also called a source region or a source electrode) or a drain (also called a drain region or a drain electrode) of the plurality of transistors 14 see FIGS. 1A and 3A. The conductive layers 18 to 25 are formed by a plasma CVD method, a sputtering method, an evaporation method, a plating method, or the like, with a single layer or a stacked layer of an element selected from titanium (Ti), aluminum (Al), or the like, or an alloy material or a compound material containing one of the above described elements as its main component. The conductive layers 18 to 25 function as source wirings or drain wirings.

Figure 3B:
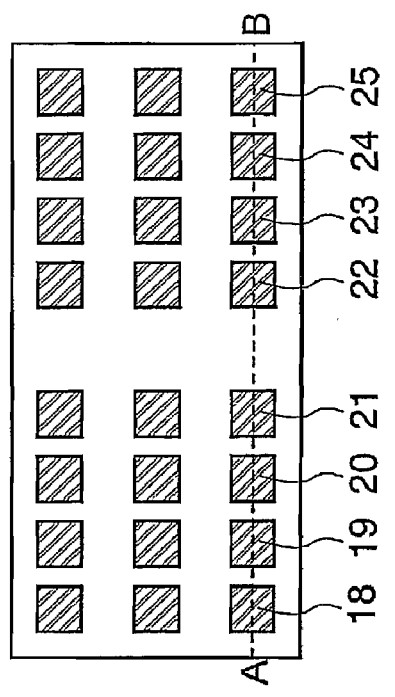

Then, an insulating layer 32 (also called a protecting layer or a buffer layer) is formed over the insulating layer 17 and the conductive layers 18 to 25 (see FIGS. 1B and 3B). The insulating layer 32 is formed with single layer or stacked layer by using a plasma CVD method, a sputtering method, a SOG method, a droplet discharging method, or the like, to have a thickness of 10 μm to 300 μm, preferably, 50 μm to 300 μm, and more preferably, 100 μm to 300 μm. Opening portions 33 to 36 are formed in the insulating layer 32. The insulating layer 32 is formed with a material such as silicone, polyethylene, polypropylene, polystyrene, AS resin, ABS resin (resin in which acrylnitrile, butadiene, and styrene are copolymerized), acrylic resin, polyvinyl chloride, polyacetal, polyamide, polycarbonate, denatured polyphenylene ether, polybutylene terephthalate, polyethylene naphthalate, polyethylene terephthalate, polysulfone, polyethersulfone, polyphenylene sulfide, polyamideimide, polymethylpentene phenol resin, urea resin, melamine resin, epoxy resin, diallylphthalate resin, unsaturated polyester resin, polyimide, polyurethane.

The thickness of the insulating layer 32 is determined as is appropriate according to the intended use of a semiconductor device, the strength which is needed for the intended use of a semiconductor device, and the reliability which is needed for a semiconductor device. The thickness of the insulating layer 32 may be thickened more to improve the strength of a semiconductor device.

When a manufacturing process is performed continuously, the insulating layer 32 may be formed by a method in which the insulating layer 32 formed over the substrate 31 is peeled off and the peeled off insulating layer 32 is provided over the insulating layer 17 and the conductive layers 18 to 25. Note that opening portions 33 to 36 are formed in the insulating layer 32 formed over the substrate 31, and these opening portions 33 to 36 may be formed by forming the insulating layer 32 on the whole surface of the substrate 31, and then using a photolithography method. In addition, the insulating layer 32 including opening portions 33 to 36 may be formed over the substrate 31 by using a screen printing method or a droplet discharging method.

In addition, for example, peeling the insulating layer 32 from the substrate 31 may be performed in the following way. First, a layer which is composed of an adhesive in which adhesion force becomes weak by heating (called an adhesion layer) is formed in advance between the substrate 31 and the insulating layer 32. And then, heating treatment is performed to weaken adhesion between the substrate 31 and the insulating layer 32, and the insulating layer 32 is peeled from the substrate 31. As another method, different to the above method, a layer which is composed of an adhesive in which adhesion force becomes weak by optical action (for example, ultraviolet radiation) is formed in advance between the substrate 31 and the insulating layer 32. Next, ultraviolet radiation is irradiated, adhesion force between the substrate 31 and the insulating layer 32 becomes weak, and the insulating layer 32 is peeled from the substrate 31.

Figure 3C:
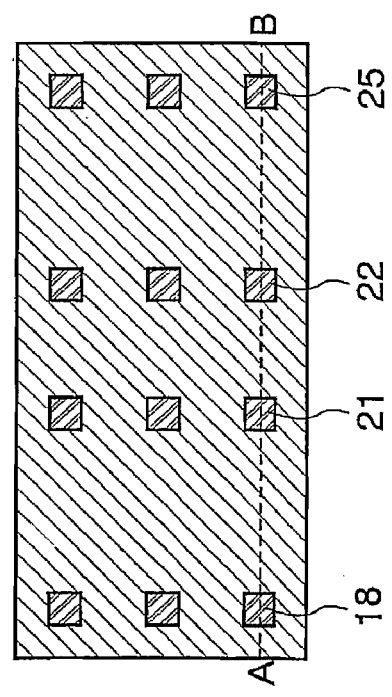

Then, an opening portion 37 (also called a hole) is formed so as to expose at least a part of the separation layer 12 (see FIGS. 2A and 3C). This process is performed by a photolithography method, laser beam irradiation, or the like, and preferably laser beam irradiation is used, because the treatment time is short. The substrate 10, the insulating layer 11, the separation layer 12, the insulating layers 13, 15 to 17, and 32 are irradiated with a laser beam. The laser beam irradiation is performed from the surface side of the insulating layer 32. The opening portion 37 is formed to expose at least a part of the separation layer 12. Accordingly, the opening portions 37 are formed in at least the insulating layers 13, 15 to 17 and 32. In a structure shown in FIGS. 2A and 3C, a case where a laser beam reaches the substrate 10 and the opening portions 37 are formed in the insulating layer 11, the separation layer 12, and the insulating layers 13, 15 to 17, and 32 is shown.

A laser includes a laser medium, an excitation source, and a resonator. Lasers can be classified by their medium into gas lasers, liquid lasers, or solid-state lasers. In addition, the lasers can be classified by their oscillation characteristics into free electron lasers, semiconductor lasers, or X-ray lasers. In the present invention, any one of such lasers may be used. Note that preferably a gas laser or a solid-state laser is used, and more preferably, a solid-state laser is used.

Note that a continuous wave laser beam or a pulsed laser beam can be used as the laser used in the present invention. In addition, an irradiation condition of a laser beam, such as frequency, power density, energy density, or beam profile may be adjusted as appropriate, taking such things as the thickness of a stacked body including the plurality of transistors 14 into consideration.

A process of irradiation with the above described laser beam uses ablation processing. Ablation processing is a process that uses a phenomenon in which a molecular bond of a portion where a laser beam is irradiated, in other words, the laser beam is absorbed, is severed, and photodegraded, and evaporated. In other words, in the present invention, the openings 37 are formed by irradiating a surface of a portion (one portion) of the substrate 10, the insulating layer 11, the separation layer 12, the insulating layers 13, 15 to 17, and 32 with a laser beam so as to cut a molecular bond and to photodegrade, and evaporate the portion.

Solid-state laser having a wavelength of 1 to 380 mm, which is an ultraviolet region, may be used as laser. Preferably, Nd:YVO$_4$ laser having a wavelength of 1 to 380 nm is used, because it is more easily absorbed in to a substrate compared with other lasers having a high wavelength, and ablation processing is easy. Further, the periphery of the processing portion is not affected by the Nd:YVO$_4$ laser, which means good processability can be provided.

Figure 2B:
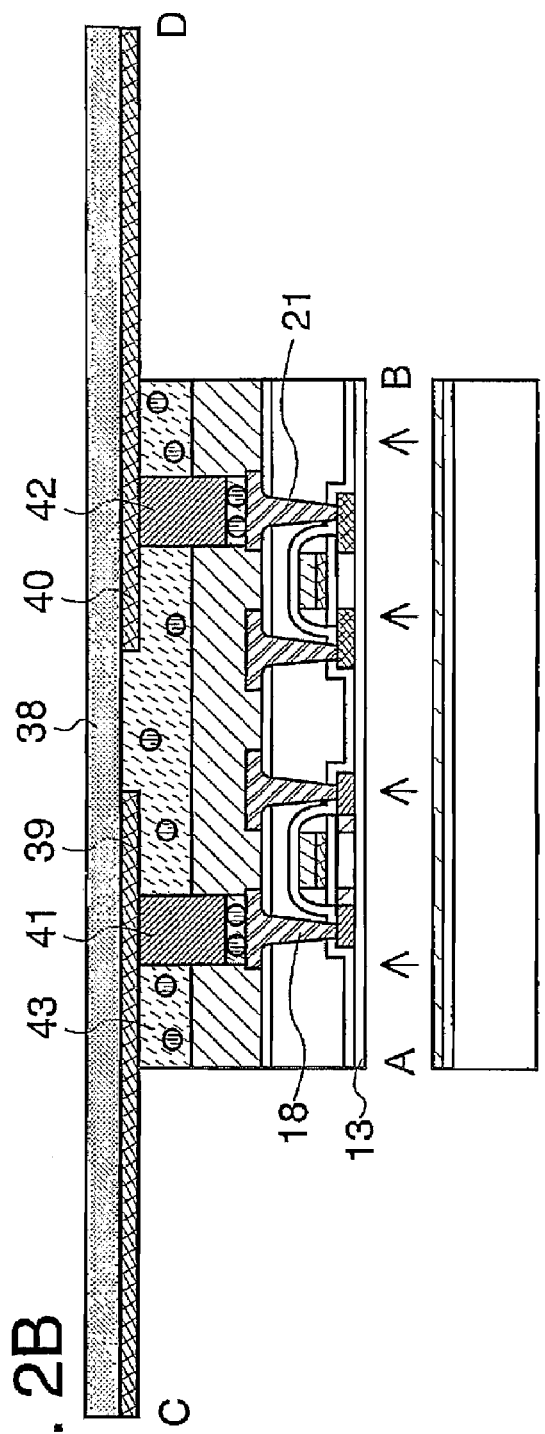

Next, a substrate 38 provided with an antenna (a conductive layer which functions as an antenna) 26 and a capacitor 27 is prepared (see FIG. 4A). The antenna 26 and the capacitor 27 are each formed by a screen printing method, a droplet discharging method, a photolithography method, a sputtering method, a CVD method, or the like. In FIG. 2B, conductive layers 39 and 40 which are a part of the antenna 26 are shown.

Next, projection electrodes (also called bumps) 41 and 42, and an anisotropic conductive layer 43 are formed over the antenna 26 and the substrate 38. The projection electrodes 41 and 42 need to have a thickness such that opening portions 33 to 36 of the insulating layer 32 are filled. Therefore, the projection electrodes 41 and 42 having a thickness of 10 μm to 300 μm, preferably, 50 μm to 300 μm are used. The projection electrodes 41 and 42 are formed with gold, silver, copper, nickel, tin, lead, solder, or the like. The anisotropic conductive layer 43 is a material in which conductive filler is provided in an adhesive, and is also called ACP (Anisotropic Conductive Paste). The anisotropic conductive layer 43 is formed with a uniform thickness by using a screen printing method, a droplet discharging method, or a photolithography method or the like. In the above structure, both of the projection electrodes 41 and 42, and the anisotropic conductive layer 43 are formed; however, the present invention is not limited to this structure. Either the electrodes 41 and 42 or the anisotropic conductive layer 43 may be formed.

The substrate 38 is bonded with a stacked body including a plurality of transistors 14 by using the projection electrodes 41 and 42 and the anisotropic conductive layer 43. The conductive layer 18 can be electrically connected with the conductive layer 39, and the conductive layer 21 can be electrically connected with the conductive layer 40 by providing the projection electrodes 41 and 42 and the anisotropic conductive layer 43. At this time, if circumstances require, either or both of pressure treatment and heat treatment are performed on the substrate 38 and the stacked body including a plurality of transistors 14, with a flip chip bonder, a die bonder, an ACF bonder, a crimping machine, or the like.

Next, the stacked body including the plurality of transistors 14 is separated from the substrate 10 by using the substrate 38 (see FIGS. 2B and 4C). Separation of the stacked body including the plurality of transistors 14 from the substrate 10 is performed with an inside of the separation layer 12 or between the separation layer 12 and the insulating layer 13 as a boundary. In the structure shown in FIGS. 2B and 4C, a case where the separation process is performed between the separation layer 12 and the insulating layer 13 as the boundary. Note that the separation process is characterized by the fact that the substrate 38 is used. In this way, by using the substrate 38, a process of separating the stacked body from the substrate 10 can be performed easily and in a short time.

Figure 5:
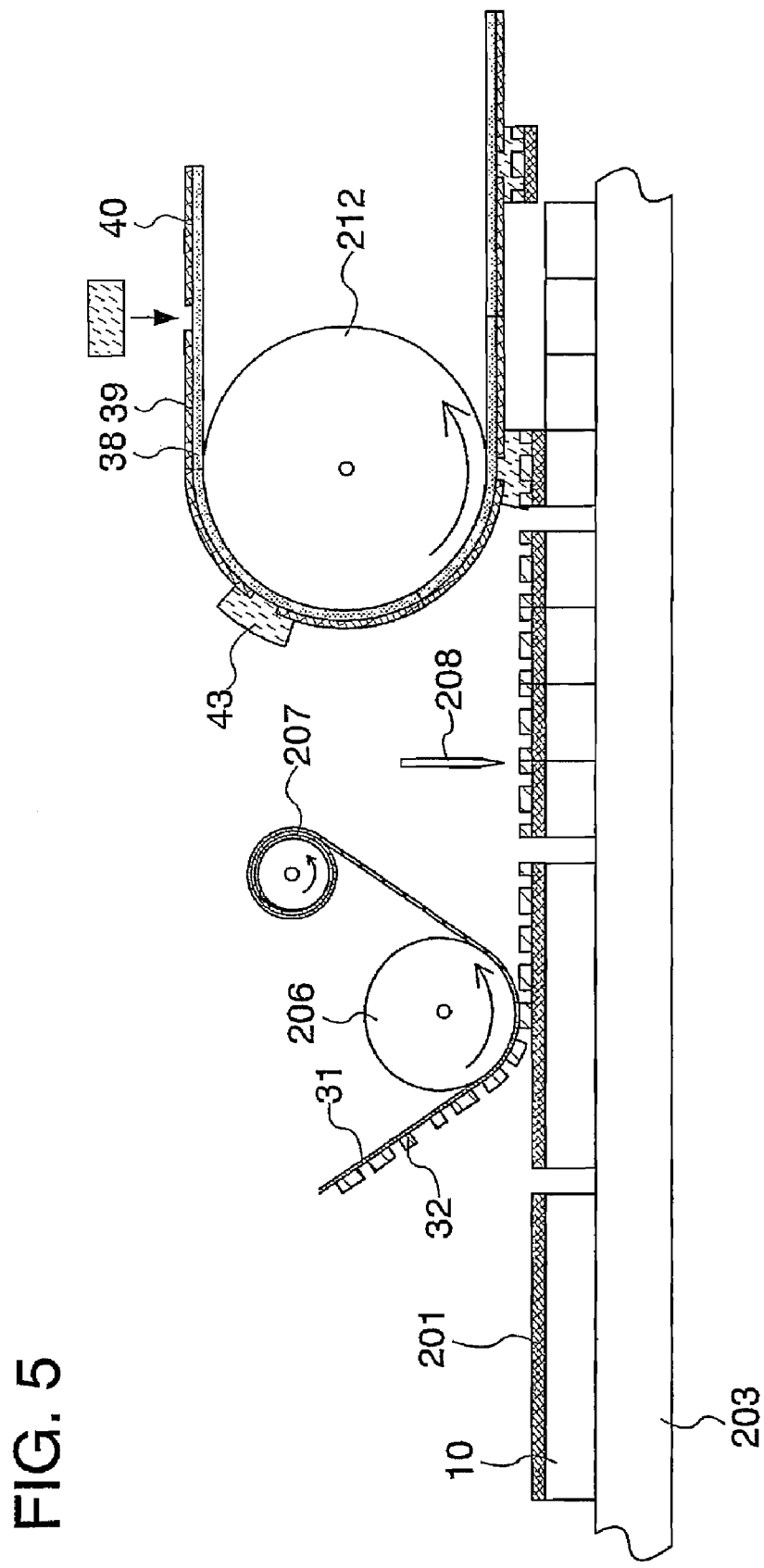
FIG. 5 shows a laminating device.

Next, a structure of a laminating device (also called a laminate device, a sealing device, or a roll to roll device) which can perform the above processes continuously is described, with reference to FIG. 5.

The laminating device has a transfer means 203 which transfers the substrate 10, a roller 206 which controls movement of the substrate 31, a roller 27 which retrieves the substrate 31, and a roller 212 which controls movement of the substrate 38. In addition, in the laminating device, the substrate 10 provided with a layer 201 including a plurality of transistors, the substrate 31 provided with the insulating layer 32, and a cutting means 208 are used.

The transfer means 203 is for transferring the substrate 10 provided with a layer 201 having a plurality of transistors, and transfers the substrate 10 at a predetermined speed in accordance with a speed at which the roller 206 rotates. The transfer means corresponds to a conveyer belt, a plurality of rollers, and a robot arm, for example. When the transfer means corresponds to a robot arm, the robot arm transfers the substrate 10, or transfers a stage provided with the substrate 10.

Each of rollers 206, 207, and 212 has a cylindrical form and rolls. For example, each of the rollers 206, 207, and 212 corresponds to a cylindrical type molded article with a refined surface, or the like. Each of the rollers 206, 207, and 212 rotates at a predetermined speed. The substrate 31 is moved by rotating the roller 206, and the substrate 31 is transported towards the direction of the roller 207. In addition, the substrate 31 is wound around the roller 27 by rotating the roller 27. In other words, the substrate 31 is retrieved by the roller 207. In addition, the substrate 38 is moved by rotating the roller 212. The cutting means 208 corresponds to a dicing device, a scribing device, a laser irradiation device, or the like.

For example, each of the rollers 206, 207, and 212 corresponds to a roller which has a cylindrical form and is provided with a rubber having a heat resistance property on the surface. An allowable temperature limit of such a rubber having a heat resistance property is 200° C. to 280° C.

Next, operation of the laminating device having the above structure is described. First, the substrate 10 provided with the layer 201 having a plurality of transistors is transferred by the transfer means 203 (see FIGS. 1A and 5). A plurality of substrates 10 are arranged systematically, and transferred sequentially.

Next, the insulating layer 32 is formed over the layer 201 including a plurality of transistors (see FIGS. 1A and 5). In this operation, the insulating layer 32 formed over the substrate 31 is peeled off, and the peeled off insulating layer 32 is formed over the layer 201 including a plurality of transistors.

In this manner, when the insulating layer 32 formed over the substrate 31 is peeled (separated) and the peeled insulating layer 32 is used, a process in which the insulating layer 32 is formed over the layer 201 including a plurality of transistors can be performed continuously. This is a great advantage, compared to a case where a technique which needs a screen (for example, a screen printing method) is used. This is because that there is a limit to the size of a screen.

Next, an opening portion is formed by the cutting means 208 so that a separation layer included in the layer 201 including a plurality of transistors is exposed (see FIGS. 2A and 5). In this process, the insulating layer 32, the layer 201 including a plurality of transistors, and the substrate 10 are cut by the cutting means 208.

Then, a stacked body of the layer 201 including a plurality of transistors is separated from the substrate 10 by using the substrate 38 provided with the conductive layers 39 and 40 (see FIGS. 2B and 5), and a semiconductor device including the substrate 38 and a plurality of transistors is formed. Note that separation the layer 201 including a plurality of transistors from the substrate 10 is performed at a boundary which is inside the separation layer or at the interface of separation layer and the insulating layer above it, as described above; however, in FIG. 5, showing the separation layer is not shown.

A manufacturing time becomes short, and productivity can be improved by performing a plurality, of processes continuously by using the above laminating device. In addition, reduction of a manufacturing cost can be achieved.

Embodiment Mode 2

Another manufacturing method of the present invention which differs from the above described method is described, with reference the cross-sectional views in FIGS. 6A to 7B, and top views in FIGS. 3A to 3C and 8A and 8B.

First, the insulating layer 11 is formed over one surface of the substrate 10 (see FIG. 6A). Next, the separation layer 12 is formed over the insulating layer 11. Then, the insulating layer 13 is formed over the separation layer 12. A plurality of transistors 14 are formed over the insulating layer 13. The insulating layers 15 to 17 are formed over the plurality of transistors 14. Opening portions are formed in the insulating layers 15 to 17, and the conductive layers 18 to 25 which are connected with each source or drain of a plurality of transistors 14 are formed (see FIGS. 6A and 3A). A substrate 45 provided with an insulating layer 46 is formed over the insulating layer 17 and the conductive layers 18 to 25 (see FIG. 6A).

Next, a stacked body including the plurality of transistors 14 is separated from the substrate 10 by using the substrate 45 provided with the insulating layer 46 (see FIG. 6B). Separation of the stacked body including the plurality of transistors 14 from the substrate 10 is performed with the inside of the separation layer 12 or the separation layer 12 and the insulating layer 13 as a boundary. In a structure which is shown, separation of the stacked body including the plurality of transistors 14 from the substrate 10 shows a case in which separation is performed with a boundary between the separation layer 12 and the insulating layer 13. In addition, a layer including an adhesive (an adhesive layer) may be formed on a surface of the insulating layer 46. Then, the stacked body including the plurality of transistors 14 may be separated from the substrate 10 by bonding the insulating layer 46 to the insulating layer 17.

Next, the substrate 45 and the insulating layer 46 are separated, and at the same time, a substrate 61 is formed over a surface of the insulating layer 11 (see FIG. 7A). A layer which is composed of an adhesive in which adhesive force becomes weak by heating (called an adhesion layer) may be formed between the substrate 45 and the insulating layer 46 for separating the substrate 45 and the insulating layer 46. Then, heating treatment is performed to weaken adhesion between the substrate 45 and the insulating layer 46 weakly, and the insulating layer 46 may be peeled from the substrate 45. In addition, as a different method to the above method, a layer which is composed of an adhesive in which adhesion force becomes weak by optical action (for example, ultraviolet radiation) may be formed between the substrate 45 and the insulating layer 46. Then, ultraviolet radiation is irradiated, adhesion force between the substrate 45 and the insulating layer 46 becomes weak, and the insulating layer 46 is peeled from the substrate 45.

In this manner, when the insulating layer 46 formed over the substrate 45 is separated and the separated insulating layer 46 is used, a process in which the insulating layer 46 is formed over the stacked body including a plurality of transistors 14 can be performed continuously. This point is a great advantage compared to a case where a technique which needs a screen (for example, a screen printing method) is used. This is because there is a limit to the size of a screen.

Next, an opening portion 62 is formed in the substrate 61, the insulating layers 13 and 15 to 17, and the insulating layer 46 (see FIG. 7B). Formation of the opening portion is performed by using a photolithography method, or irradiating a laser beam.

Figure 8A:
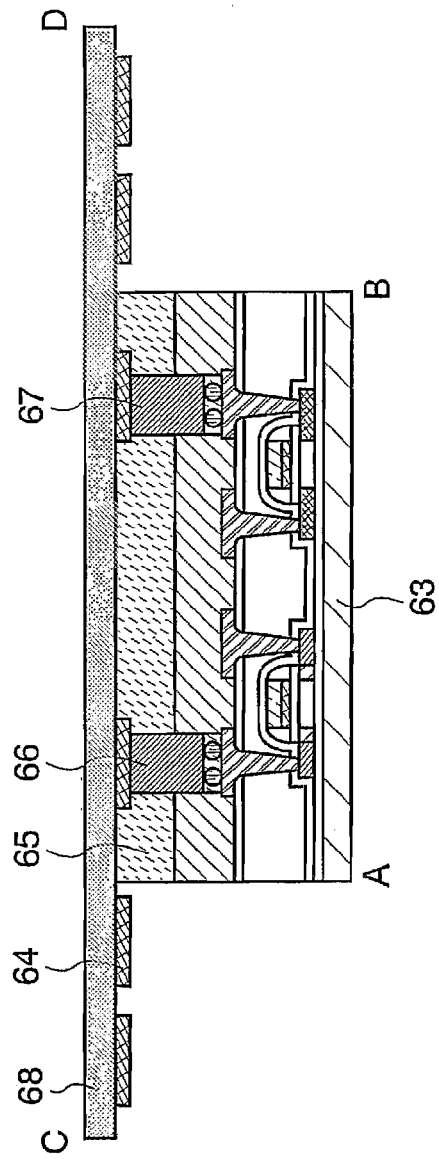
FIGS. 8A to 8C show a semiconductor device of the present invention and a manufacturing method thereof.
Figure 8B:
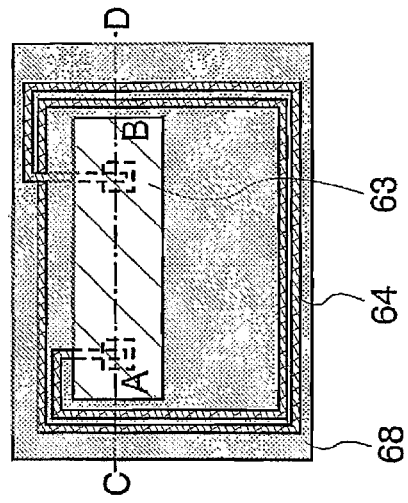

Then, a substrate 68 provided with an antenna 64 is prepared (see FIG. 8B). The antenna 64 is formed by a screen printing method, a droplet discharging method, a photolithography method, a sputtering method, a CVD method, or the like. Projection electrodes 66 and 67 and an anisotropic conductive layer 65 are formed over the antenna 64 and the substrate 68.

Figure 8C:
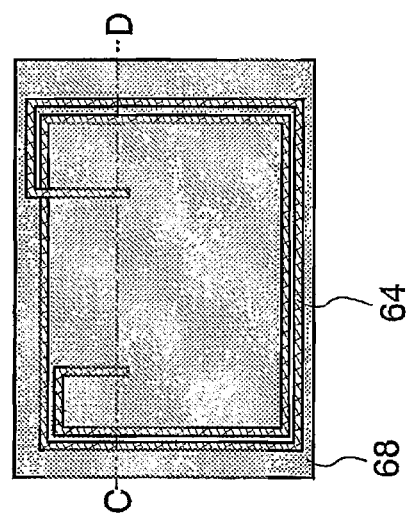

A substrate 63 and the stacked body including the plurality of transistors 14 are bonded by using the anisotropic conductive layer 65 (see FIGS. 8A and 8C). If circumstances require, either or both of pressure treatment and heat treatment are performed to the substrate 63 and the stacked body including the plurality of transistors 14, with a flip chip bonder, a die bonder, an ACF bonder, a crimping machine, or the like.

A structure of a laminating device which can perform a plurality of processes mentioned above continuously is described with reference to FIGS. 9A and 9B.

A laminating device has a transfer means 203 which transfers the substrate 10, rollers 223 to 226 which control movement of the substrate 45, a roller 222 which retrieves the substrate 45, rollers 227 and 228 which control movement of the substrate 61, and a roller 221 which supplies the substrate 61 to the rollers 227 and 228. In addition, in the laminating device, the substrate 10 provided with a layer 201 including a plurality of transistors, the substrate 45 provided with the insulating layer 46, a cutting means 208, and the substrate 68 provided with the antenna 64 are used (see FIG. 9B).

Rollers 212 and 221 to 228 each rotate at a predetermined speed. The substrate 45 is moved by rotation of the rollers 223 to 226. In addition, through the rotation of the roller 222, the substrate 45 winds around the roller 222. The substrate 61 is moved by the rotation of the rollers 227 and 228. The substrate 61 is supplied to the direction of the rollers 227 and 228 by the rotation of the roller 221.

Next, operation of the above laminating device is described below.

Figure 9A:
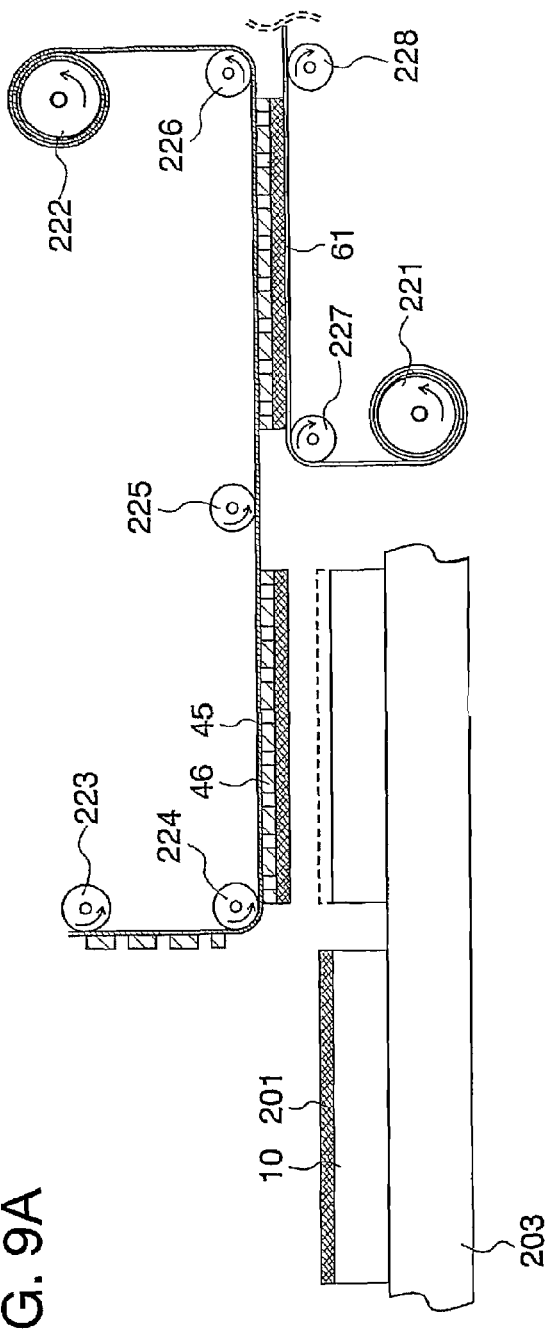
FIGS. 9A and 9B show a laminating device.

First, the substrate 10 provided with the layer 201 having a plurality of transistors is transferred by the transfer means 203 (see FIGS. 6A and 9A). A plurality of substrates 10 are arranged systematically, and transferred sequentially.

The substrate 45 is formed over the layer 201 including a plurality of transistors. The layer 201 including a plurality of transistors is separated from the substrate 10 by using the substrate 45 (see FIGS. 6A, 6B and 9A). The insulating layer 46 has been formed over the substrate 45. In addition, separation of the layer 201 including a plurality of transistors from the substrate 38 is performed with the boundary being the inside of the separation layer, or the interface of the separation layer and the insulating layer above it, as described above; however, in FIG. 5, the separation layer is not shown.

Figure 9B:
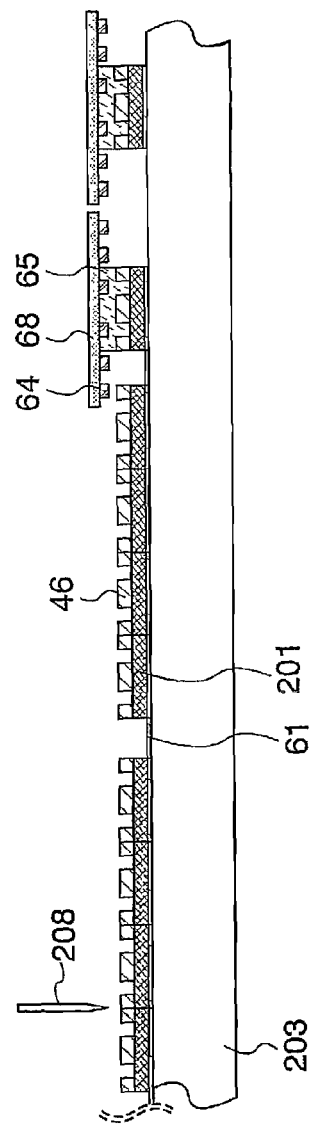
Figure 10C:
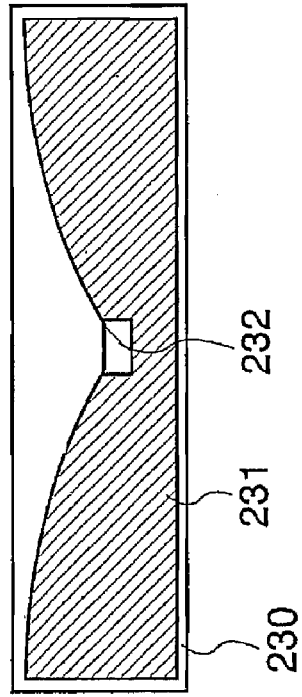
FIGS. 10A to 10D show substrates provided with conductive layers.
Figure 10D:
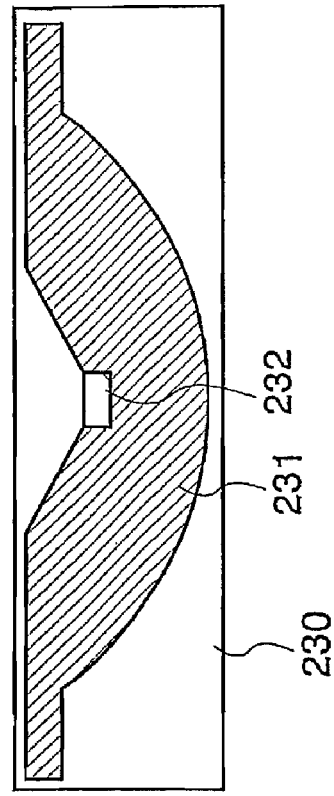
Figure 10A:
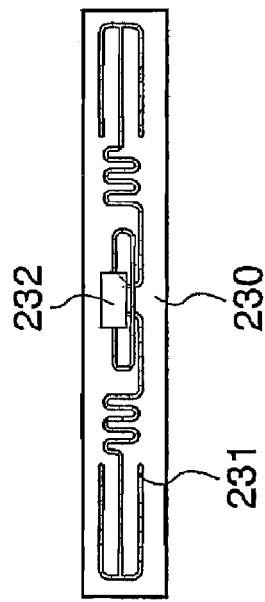
Figure 10B:
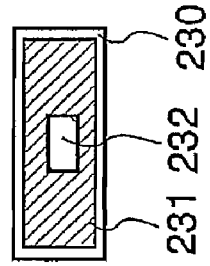

The substrate 61 is formed over a surface of the layer 201 including a plurality of transistors, and at the same time, the insulating layer 46 is separated from the substrate 45 (see FIGS. 7A and 9B). Next, the substrate 61, the layer 201 including the plurality of transistors, and the insulating layer 46 are cut by the cutting means 208 (see FIGS. 7B and 9B). Then, the substrate 68 provided with the antenna 64 is attached to the stacked body having the layer 201 including a plurality of transistors (see FIGS. 8A and 9B). Thus, a semiconductor device including the substrate 38 and a plurality of transistors is formed.

By using the above laminating device and performing a plurality of processes continuously, manufacturing time can be shortened, and productivity can be improved. In addition, manufacturing costs can be reduced.

Embodiment 1

An example of a substrate provided with a conductive layer which is used for the semiconductor device of the present invention is described. A substrate provided with a conductive layer has, for example, the two types described below. A conductive layer functions as an antenna or a connecting wiring.

One is a substrate over which a conductive layer is formed. The conductive layer is formed with copper, silver, gold, aluminum, titanium, or the like. An exposed portion of the conductive layer is plated by gold or the like for inhibiting oxidation.

The other is a substrate in which a conductive layer is formed over the substrate, and a protective layer is formed over the conductive layer. The protective layer is provided with the substrate and/or insulating resin. The insulating resin is, for example, an epoxy resin, a silicone resin, or a synthetic rubber resin. In the protective layer, an opening (an opening portion) is formed in a desired portion, and the conductive layer is exposed through the opening.

When a conductive layer 231 formed over a substrate 230 functions as an antenna, formation of the conductive layer 231 is not limited (see FIGS. 10A to 10D). For example, it may be formed as a linear shape (a dipole antenna or the like, see FIG. 10A), a circular formation (a loop antenna), a spiral shape (a spiral antenna), a rectangular solid shape (a patch antenna or the like, see FIG. 10B), a ribbon shape (see FIG. 10C), a curved shape (see FIG. 10D), or the like. When a stacked body 232 including a plurality of transistors is bonded to the surface of the substrate 230 provided with the conductive layer 231, a semiconductor device which can transmit and receive data wirelessly is formed.

In addition, a material which forms the conductive layer is not limited. For example, gold, silver, copper, or the like may be used as a material; among them, silver may be used because of its low resistance. Furthermore, the manufacturing method is not limited, and a sputtering method, a CVD method, a screen printing method, a droplet discharging method (for example, an inkjet method), a dispenser method, or the like may be used.

Note that when an antenna is directly attached to a metal surface, an eddy current is generated in the metal by magnetic flux passing through the metal surface. Such an eddy current is generated in a direction opposite to a magnetic field of a reader/writer. Thus, ferrite having high magnetic permeability and a low high-frequency loss or a metal thin film sheet is preferably interposed between the antenna and the conductive layer, thereby preventing generation of an eddy current.

It is preferable that a substrate (also called a base, a film, or a tape) has a property of flexibility. The substrate may be formed with a single layer, or a stacked layer. In addition, an adhesive layer may be formed on the surface. The adhesive layer is a layer including an adhesive. A surface of the substrate may be coated by silicon dioxide (silica). By coating, a water proof property can be maintained even in a high temperature, high humidity environment. Further, the surface may be coated with a conductive material such as indium tin oxide. The coating material charges static electricity, and the stacked body including a plurality of transistors 14 can be protected from static electricity. In addition, the surface may also be coated with a material containing carbon as its main component (for example, diamond-like carbon). Strength can be enhanced by coating, and deterioration or breakdown of the stacked body including the plurality of transistors 14 can be suppressed. Further, the substrate may also be formed by using a material in which a base material (such as a resin) is mixed with silicon dioxide, a conductive material, or a material containing carbon as its main component.

Embodiment 2

Figure 11:
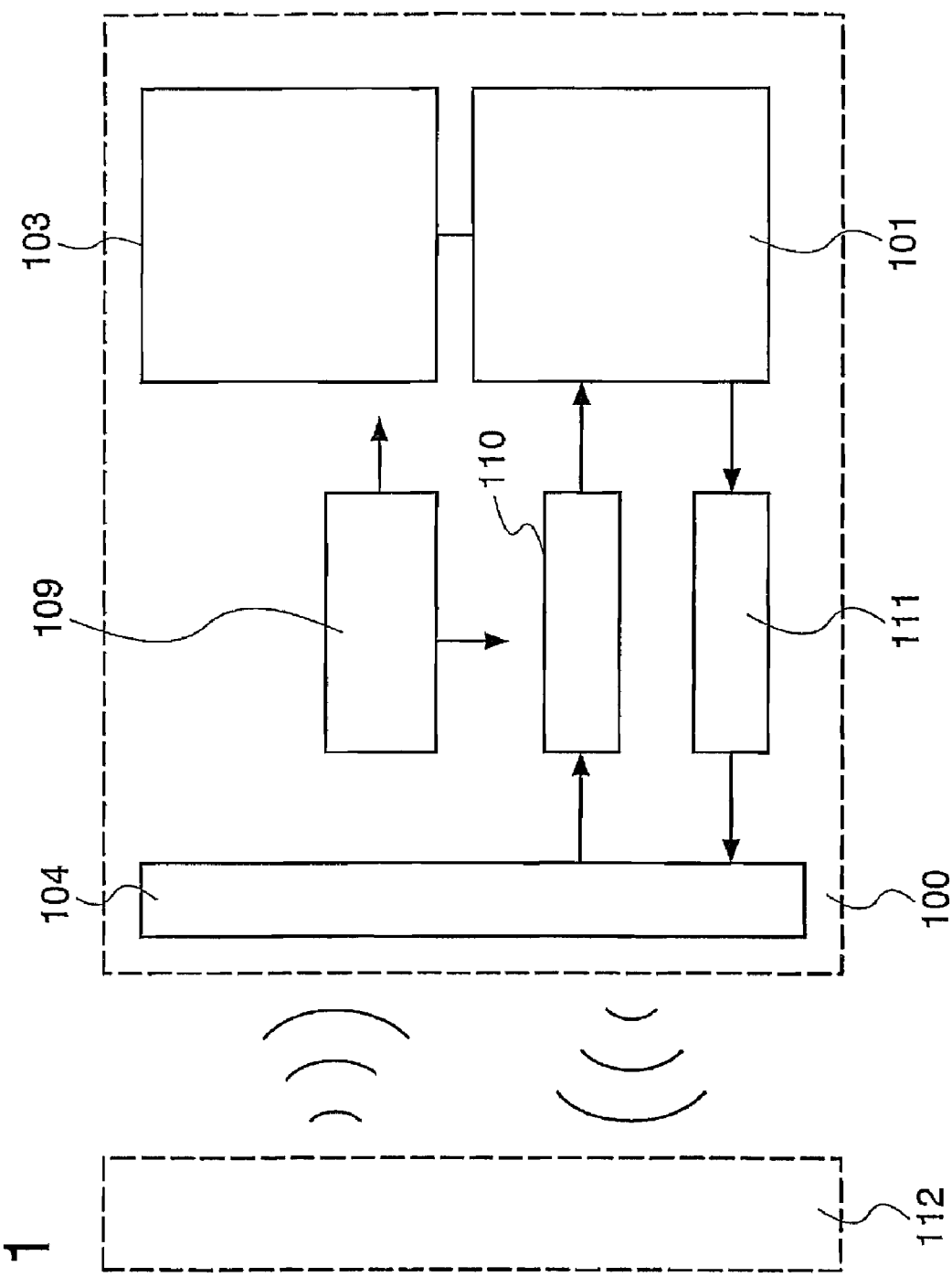
FIG. 11 shows a semiconductor device.

A configuration of a semiconductor device of the present invention is described with reference to FIG. 11. A semiconductor device 100 of the invention has an arithmetic processing circuit 101, a memory circuit 103, an antenna 104, a power supply circuit 109, a demodulating circuit 110, and a modulating circuit 111.

In accordance with a signal inputted from the demodulating circuit 110, the arithmetic processing circuit 101 analyzes instructions, controls the memory circuit 103, outputs data to be transmitted to the outside to the modulating circuit 111, and the like.

The memory circuit 103 has a circuit including a memory element and a control circuit for controlling writing and reading of data. The memory circuit 103 stores at least an identification number of the semiconductor device itself. The identification number is used to distinguish the semiconductor device from other semiconductor devices. In addition, the memory circuit 103 has one or more memories selected from among an organic memory, a DRAM (Dynamic Random Access Memory), an SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure where a layer containing an organic compound is sandwiched between a pair of conductive layers. Since the organic memory has a simple structure, manufacturing steps can be simplified and cost reduction can be achieved. In addition, because of the simple structure it is easy to reduce the area of the stacked body and achieve high capacity. Further, the organic memory is advantageous in that it is a non-volatile memory and does not require a battery. Therefore, the organic memory is preferably used as the memory circuit 103.

The antenna 104 converts a carrier wave supplied from a reader/writer 112 into an alternating current electrical signal. The modulating circuit 111 modulates the load. The power supply circuit 109 generates a power supply voltage using an alternating current electrical signal converted by the antenna 104, and supplies the power supply voltage to each circuit.

The demodulating circuit 110 demodulates an alternating current electrical signal converted by the antenna 104, and supplies the demodulated signal to the arithmetic processing circuit 101. The modulating circuit 111 modulates the load to the antenna 104 in accordance with a signal supplied from the arithmetic processing circuit 101.

The reader/writer 112 receives the modulated load of the antenna 104 as a carrier wave. The reader/writer 112 also transmits the carrier wave to the semiconductor device 100. Note that the carrier wave is an electromagnetic wave transmitted from the reader/writer 112.

Embodiment 3

A semiconductor device 125 of the present invention can be used in various articles and various systems by utilizing the function of transmitting and receiving data wirelessly. As examples of articles, keys (see FIG. 12A), paper money, coins, securities, bearer bonds, certificates (a driver's license, a resident's card, or the like), books, containers (a petri dish or the like, see FIG. 12B), personal accessories and ornaments (bags, glasses, or the like, see FIG. 12C), packing and wrapping containers (wrapping paper, bottles, or the like, see FIG. 12D), recording media (a disk, a video tape, or the like), vehicles (a bicycle or the like), foods, clothing, everyday articles, electronic devices (a liquid crystal display device, an EL display device, a television device, a portable terminal, or the like), or the like can be given. Note that the semiconductor device of the present invention is fixed to articles of various forms as described above by being attached to a surface of an article or by being embedded into an article.

In addition, "system" refers to a physical distribution inventory management system, an authentication system, a distribution system, a production record system, a book management system, or the like. By using a function of the semiconductor device of the present invention which can transmit and receive data wirelessly, sophistication, multifunctionality, and high added value of the system can be achieved.

Concretely, the system which improves convenience is described. This system uses a semiconductor device of the present invention, a reader/writer, and a computer. First, the semiconductor device of the present invention is provided inside an identification card, and a reader/writer 121 is provided at an entrance of a building or the like where certification function is needed (see FIG. 12E). The reader/writer 121 reads an identification number which is inside the identification card that every person possesses and supplies information connected with the identification number that has been read to a computer 122. The computer 122 determines whether or not to authorize the person's entrance or exit, based on the information provided from the reader/writer 121. In this way, by using the function of the semiconductor device of the present invention whereby data can be transmitted and received wirelessly, an entrance-exit management system in which convenience is improved can be provided.

Embodiment 4

The semiconductor device of the present invention has a plurality of transistors. Each of the transistors has a semiconductor layer, a gate insulating layer, and a gate electrode. First, an example of a manufacturing method of a semiconductor layer which is included in each of the transistors is described.

First, an amorphous semiconductor layer is formed by a sputtering method, an LPCVD method, a plasma CVD method, or the like. Next, the amorphous semiconductor layer is crystallized by a laser crystallization method, an RTA (Rapid Thermal Anneal) method, a thermal crystallization method using an annealing furnace, a thermal crystallization method using a metal element promoting crystallization, a method in which the thermal crystallization method using a metal element promoting crystallization and the laser crystallization method are combined, or the like, to form a crystalline semiconductor layer. Then, the crystalline semiconductor layer obtained is patterned (pattern processing) to form a desired shape.

The crystallized semiconductor layer is preferably formed by a combination of a crystallization method including thermal treatment and a crystallization method in which irradiation of a continuous wave laser or a laser beam oscillating with a frequency of 10 MHz or more is conducted. By irradiating the semiconductor layer with a continuous wave laser or a laser beam oscillating with a frequency of 10 MHz or more, a surface of the crystallized semiconductor layer can be planarized. In addition, by planarizing the surface of the semiconductor layer, the gate insulating layer which is formed as the upper layer of the semiconductor layer can be thinned. Further, the pressure-resistance of the gate insulating layer can be improved.

In addition, the crystallized semiconductor layer is preferably formed by a continuous wave laser or a laser beam oscillating with a frequency of 10 MHz or more. The semiconductor layer which is crystallized by being scanned into one direction with a continuous wave laser or a laser beam oscillating with a frequency of 10 MHz or more, has a characteristic that crystals are grown in a scanning direction of the beam. A transistor in which variation of characteristics is small and field effect mobility is high can be obtained by positioning the transistor so as to align the scanning direction with a channel length direction (a direction in which carriers flow when a channel forming region is formed) and employing the method described above to form a gate insulating layer.

Subsequently, one example of a manufacturing method of the gate insulating layer which is included in each of the transistors is described. The gate insulating layer may be formed by performing plasma treatment to the semiconductor layer, in which oxidation or nitridation of the surface of the semiconductor layer is performed. For example, plasma treatment in which a rare gas (He, Ar, Kr, Xe, or the like), and a mixed gas (oxygen, oxidized nitrogen, ammonia, nitrogen, hydrogen, or the like) is introduced is performed. In this case, excitation of plasma is preferably performed by introducing a microwave. This is because by introducing the microwave, plasma with a high density and a low electron temperature can be generated. The surface of the semiconductor layer can be oxidized or nitrided by oxygen radicals (OH radicals may be included) or nitrogen radicals (NH radicals may be included) generated with this high-density plasma, thereby forming an insulating layer with a thickness of 5 to 10 nm over the semiconductor layer. This insulating layer is used as a gate insulating layer.

Since the reaction by the treatment using high-density plasma in this case is a solid-phase reaction, an interface state density between the gate insulating layer and the semiconductor layer can be made extremely low. In such high-density plasma treatment, since a semiconductor layer (crystalline silicon or polycrystalline silicon) is directly oxidized (or nitrided), variation in the thickness of a gate insulating layer to be formed can be made extremely small. In addition, a semiconductor layer in a crystal grain boundary of crystalline silicon is not oxidized too much, and a very desirable state can be obtained. In other words, in the high density plasma treatment described herein, by solid-phase oxidizing the surface of the semiconductor layer, the gate insulating layer can be formed to have good uniformity and low interface state density, without excessive oxidation in a crystal grain boundary.

As for the gate insulating layer included in transistors, the insulating layer formed by high density plasma treatment may be used, or an insulating layer of silicon oxide, silicon oxynitride, silicon nitride, or the like may be stacked over the insulating layer by a CVD method using plasma or thermal reaction. In either case, variation of characteristics can be reduced in a transistor including the insulating layer formed by using high density plasma as the gate insulating layer or as a part of the gate insulating layer.

In addition, the semiconductor layer and the gate insulating layer which are included in the transistor, and another insulating layer are formed by plasma treatment in some cases. Such a plasma treatment is preferably conducted with an electron density of $1 \times 10^{11}$ cm$^{-3}$ or more and a plasma electron temperature of 1.5 eV or less. In more detail, the plasma treatment is preferably conducted with an electron density of $1 \times 10^{11}$ cm$^{-3}$ to $1 \times 10^{13}$ cm$^{-3}$ and a plasma electron temperature of 0.5 eV or more and 1.5 eV or less.

When plasma has a high electron density, and a low electron temperature in the vicinity of an object to be processed (for example, the semiconductor layer and the gate insulating layer which are included in the transistor, or the like), the object to be processed can be prevented from being damaged from the plasma. In addition, since an electron density of plasma is as high as or more than $1\times10^{11}$ cm$^{-3}$, oxide or nitride formed by oxidizing or nitriding an object to be processed using plasma treatment is superior in uniformity of film thickness and the like and can be a denser film, compared with a thin film formed by a CVD method, a sputtering method, or the like. In addition, since the electron temperature of the plasma is as low as or less than 1.5 eV, oxidizing treatment or nitriding treatment can be conducted at a lower temperature, compared with conventional plasma treatment or a thermal oxidation method. For example, even when plasma treatment is performed at a temperature 100° C. or more lower than a strain point of a glass substrate, an oxide or an nitride can be formed by oxidizing or nitriding the object to be processed sufficiently.

This application is based on Japanese Patent Application serial No. 2005-222161 filed in Japan Patent Office on Jul. 29, 2005 the entire contents of which are hereby incorporated by reference.

EXPLANATION OF REFERENCES

10: SUBSTRATE, 11: INSULATING LAYER, 12: SEPARATION LAYER, 13: INSULATING LAYER, 14: PLURALITY OF TRANSISTORS, 15: INSULATING LAYER, 16: INSULATING LAYER, 17: INSULATING LAYER, 18: CONDUCTIVE LAYER, 19: CONDUCTIVE LAYER, 20: CONDUCTIVE LAYER, 21: CONDUCTIVE LAYER, 22: CONDUCTIVE LAYER, 23: CONDUCTIVE LAYER, 24: CONDUCTIVE LAYER, 25: CONDUCTIVE LAYER, 26: ANTENNA, 27: CAPACITATIVE ELEMENT, 31: SUBSTRATE, 32: INSULATING LAYER, 33: OPENING PORTION, 34: OPENING PORTION, 35: OPENING PORTION, 36: OPENING PORTION, 37: OPENING PORTION, 38: SUBSTRATE, 39: CONDUCTIVE LAYER, 40: CONDUCTIVE LAYER, 41: PROJECTION ELECTRODE, 42: PROJECTION ELECTRODE, 43: ANISOTROPIC CONDUCTIVE LAYER, 45: SUBSTRATE, 46: INSULATING LAYER, 47: OPENING PORTION, 48: OPENING PORTION, 49: OPENING PORTION, 50: SEMICONDUCTOR LAYER, 51: INSULATING LAYER, 52: CONDUCTIVE LAYER, 53: IMPURITY REGION, 54: IMPURITY REGION, 55: CHANNEL FORMING REGION, 60: OPENING PORTION, 61: SUBSTRATE, 62: OPENING PORTION, 63: SUBSTRATE, 64: ANTENNA, 65: ANISOTROPIC CONDUCTIVE LAYER, 66: PROJECTION ELECTRODE, 67: PROJECTION ELECTRODE, 68: SUBSTRATE, 100: SEMICONDUCTOR DEVICE, 101: ARITHMETIC PROCESSING CIRCUIT, 103: MEMORY CIRCUIT, 104: ANTENNA, 109: POWER SUPPLY CIRCUIT, 110: DEMODULATION CIRCUIT, 111: MODULATION CIRCUIT, 112: READER/WRITER, 121: READER/WRITER, 122: COMPUTER, 125: SEMICONDUCTOR DEVICE.

What is claimed is:

1. A manufacturing method of a semiconductor device, comprising the steps of:
    forming a first insulating layer over a first substrate provided with a transistor;
    forming a first conductive layer electrically connected with a source or a drain of the transistor;
    forming a second insulating layer having an opening over a second substrate;
    arranging the second substrate provided with the second insulating layer having the opening so that the first insulating layer is attached to the second insulating layer and the opening is overlapped with the first conductive layer;
    separating the second substrate from the second insulating layer, and
    arranging a third substrate provided with an anisotropic conductive layer and a second conductive layer so that the first conductive layer is directly in contact with the anisotropic conductive layer in the opening.

2. The manufacturing method of the semiconductor device according to claim 1, wherein the step of separating the second substrate is performed before the step of arranging the third substrate.

3. The manufacturing method of the semiconductor device according to claim 1, wherein the anisotropic conductive layer is formed over the third substrate provided with the second conductive layer.

4. The manufacturing method of the semiconductor device according to claim 1, wherein the second conductive layer functions as an antenna.

5. The manufacturing method of the semiconductor device according to claim 1, wherein the first substrate is a glass substrate.

6. The manufacturing method of the semiconductor device according to claim 1, wherein the second substrate is flexible.

7. The manufacturing method of the semiconductor device according to claim 1, wherein a thickness of the second insulating layer is 10 μm to 300 μm.

8. The manufacturing method of the semiconductor device according to claim 1, wherein the second insulating layer includes resin.

9. The manufacturing method of the semiconductor device according to claim 1, wherein the second insulating layer comprises a material selected from the group consisting of silicone, polyethylene, polypropylene, polystyrene, acrylic, polyvinyl chloride, polyacetal, polyamide, polycarbonate, polybutylene terephthalate, polyethylene naphthalate, polyethylene terephthalate, polyphenylene sulfide, polyamideimide, polymethylpentene, phenol, urea, melamine, epoxy, diallylphthalate, polyimide, and polyurethane.

10. The manufacturing method of the semiconductor device according to claim 1, wherein the third substrate is a plastic substrate.

11. The manufacturing method of the semiconductor device according to claim 1, wherein the transistor is formed over the first substrate.

12. The manufacturing method of the semiconductor device according to claim 1, wherein the transistor is a thin film transistor.

13. A manufacturing method of a semiconductor device, comprising the steps of:
    forming a first insulating layer over a first substrate provided with a transistor;
    forming a first conductive layer electrically connected with one of a source and a drain of the transistor;
    arranging a second substrate provided with a second insulating layer so that the first insulating layer is attached to the second insulating layer, the second insulating layer having an opening so as to expose the first conductive layer;
    separating the second substrate from the second insulating layer;
    arranging a third substrate provided with an anisotropic conductive layer and a second conductive layer so that the anisotropic conductive layer is directly in contact with the first conductive layer in the opening; and
    separating the first substrate from the third substrate.

14. The manufacturing method of the semiconductor device according to claim 13, wherein the step of separating the second substrate is performed before the step of arranging the third substrate.

15. The manufacturing method of the semiconductor device according to claim 13, wherein the anisotropic conductive layer is formed over the third substrate provided with the second conductive layer.

16. The manufacturing method of the semiconductor device according to claim 13, wherein the second conductive layer functions as an antenna.

17. The manufacturing method of the semiconductor device according to claim 13, wherein the first substrate is a glass substrate.

18. The manufacturing method of the semiconductor device according to claim 13, wherein the second substrate is flexible.

19. The manufacturing method of the semiconductor device according to claim 13, wherein a thickness of the second insulating layer is 10 μm to 300 μm.

20. The manufacturing method of the semiconductor device according to claim 13, wherein the second insulating layer includes resin.

21. The manufacturing method of the semiconductor device according to claim 13, wherein the second insulating layer comprises a material selected from the group consisting of silicone, polyethylene, polypropylene, polystyrene, acrylic, polyvinyl chloride, polyacetal, polyamide, polycarbonate, polybutylene terephthalate, polyethylene naphthalate, polyethylene terephthalate, polyphenylene sulfide, polyamideimide, polymethylpentene, phenol, urea, melamine, epoxy, diallylphthalate, polyimide, and polyurethane.

22. The manufacturing method of the semiconductor device according to claim 13, wherein the third substrate is a plastic substrate.

23. The manufacturing method of the semiconductor device according to claim 13, wherein the transistor is formed over the first substrate.

24. The manufacturing method of the semiconductor device according to claim 13, wherein the transistor is a thin film transistor.

* * * * *